United States Patent
Tsukazaki et al.

(10) Patent No.: US 7,663,933 B2
(45) Date of Patent: Feb. 16, 2010

(54) MEMORY CONTROLLER

(75) Inventors: Fumiaki Tsukazaki, Osaka (JP); Tetsuo Furuichi, Osaka (JP)

(73) Assignee: MegaChips Corporation, Osaka (JP)

( * ) Notice: Subject to any disclaimer, the term of this patent is extended or adjusted under 35 U.S.C. 154(b) by 18 days.

(21) Appl. No.: 11/968,492

(22) Filed: Jan. 2, 2008

(65) Prior Publication Data

US 2008/0259708 A1 Oct. 23, 2008

(30) Foreign Application Priority Data

Feb. 7, 2007 (JP) ............................. 2007-028167

(51) Int. Cl.
*G11C 16/06* (2006.01)
(52) U.S. Cl. .............. 365/185.25; 365/222; 365/189.16
(58) Field of Classification Search ............ 365/185.25, 365/222, 189.16
See application file for complete search history.

(56) References Cited

U.S. PATENT DOCUMENTS

| | | | | |
|---|---|---|---|---|
| 5,270,967 A | * | 12/1993 | Moazzami et al. | 365/145 |
| 5,381,379 A | * | 1/1995 | Fukumoto | 365/238.5 |
| 5,777,921 A | * | 7/1998 | Takata et al. | 365/145 |
| 6,522,572 B2 | * | 2/2003 | Nakamura | 365/145 |
| 6,751,127 B1 | * | 6/2004 | Chou et al. | 365/185.25 |
| 6,751,766 B2 | * | 6/2004 | Guterman et al. | 714/736 |
| 7,006,383 B2 | * | 2/2006 | Tanaka | 365/185.29 |
| 7,196,860 B2 | * | 3/2007 | Alex | 360/31 |
| 7,246,210 B2 | * | 7/2007 | Georgis et al. | 711/161 |
| 7,262,994 B2 | * | 8/2007 | Fong et al. | 365/185.17 |
| 7,493,531 B2 | * | 2/2009 | Ito et al. | 714/708 |
| 7,495,944 B2 | * | 2/2009 | Parkinson et al. | 365/148 |
| 2005/0210184 A1 | | 9/2005 | Chen et al. | |

FOREIGN PATENT DOCUMENTS

| JP | 409265784 A | * | 10/1997 |
|---|---|---|---|
| JP | 02004185745 | * | 7/2004 |
| JP | 02006059403 | * | 3/2006 |

* cited by examiner

*Primary Examiner*—Viet Q Nguyen
(74) *Attorney, Agent, or Firm*—Oblon, Spivak, McClelland, Maier & Neustadt, L.L.P.

(57) ABSTRACT

A memory controller for controlling data access to a memory comprises a refresh controller. A read count memory part included in the refresh controller counts the number of read operations on each page of the memory and stores the read count therein. If the read count for any page exceeds a predetermined number, the refresh controller rewrites data stored in this page into the memory.

16 Claims, 5 Drawing Sheets

MEMORY CONTROLLER

BACKGROUND OF THE INVENTION

1. Field of the Invention

The present invention relates to a technique to avoid unintended rewriting of data or reduce the possibility thereof, due to repeated readouts of data from a nonvolatile memory.

2. Description of the Background Art

NAND flash memories, among nonvolatile memories, are heavily used for SD memory cards or the like for the purpose of achieving high integration, reduction in manufacturing cost and easy writing for users by simplifying circuit configurations.

In recent, NAND flash memories are adopted for game machines or the like. When the NAND flash memories are used for game machines, there occurs no write operation but only consecutive read operations. In other words, NAND flash memories have been increasingly adopted as ROMs.

Since specific programs are repeatedly read out in the game machines or the like in most cases, however, it begins to be noticed that the programs could be unintendedly rewritten. Such a phenomenon is termed "read disturb phenomenon", and the mechanism of this phenomenon will be briefly discussed below.

FIG. 7 is a schematic diagram showing an NAND flash memory. The NAND flash memory is constituted of a bit line 41 and word lines 42, 43 and 44 which are arranged in a lattice manner, memory cells 52 and 53, a selection transistor 54 and the like.

In a case where binary data ("0" or "1") stored in the memory cell 52 is read out, the memory cell 52 is a selected cell and the memory cell 53 is an unselected cell. First, the selection transistor 54 specifies the bit line 41 to which the selected cell 52 belongs. Next, a low gate voltage (V(Low)=0V) is applied to the word line 42 to which the selected cell 52 belongs. Then, a high gate voltage (V(High)) of approximately 5V) is applied to the word line 43 to which the unselected cell 53 belongs. At that time, since the unselected cell 53 is in a very weak writing condition, electrons are trapped in a floating gate of the unselected cell 53 and accumulated therein. In other words, when binary data stored in the selected cell 52 is repeatedly read out, there is a possibility that a threshold voltage of the unselected cell 53 might be shifted and binary data stored in the unselected cell 53 might be unintendedly rewritten, being changed from "1" to "0".

Even if the binary data stored in the unselected cell 53 is unintendedly rewritten, however, when data are collectively erased before new data are written, it is possible to recover the function of the unselected cell 53. But, if there occurs no write operation and only consecutive read operations, it is impossible to recover the function of the unselected cell 53.

U.S. patent application publication No. 2005/0210184 discloses means for avoiding the above-discussed read disturb phenomenon by controlling the inside of a memory cell. This disclosed method, however, can be applied to a memory having a specific cell configuration but can not be applied to any other cell configuration. In other words, by this method, it is impossible to avoid the read disturb phenomenon without depending on cell configurations of memories.

SUMMARY OF THE INVENTION

The present invention is intended for a memory controller for controlling access to a rewritable nonvolatile semiconductor memory.

According to an aspect of the present invention, the memory controller comprises area determination means for determining a refresh target area in a memory area of the nonvolatile semiconductor memory, and rewriting means for rewriting stored data which is stored in the refresh target area into the memory area in the nonvolatile semiconductor memory.

In the present invention, it is possible to refresh data before unintended rewrite of data due to a large number of readouts.

According to another aspect of the present invention, the area determination means includes means for determining an area whose read count exceeds a predetermined number among the memory areas in the nonvolatile semiconductor memory as the refresh target area.

It is thereby possible to intensively refresh an area on which reading is concentrated and refresh data before unintended rewrite of data due to a large number of readouts.

According to still another aspect of the present invention, the area determination means includes means for determining all the memory areas in the nonvolatile semiconductor memory sequentially as the refresh target area in accordance with a predetermined rule.

It is thereby possible to refresh data before unintended rewrite of data due to a large number of readouts.

According to yet another aspect of the present invention, the area determination means includes means for determining a predetermined area among the memory areas in the nonvolatile semiconductor memory as the refresh target area.

It is thereby possible to refresh data on an area on which it is assumed that reading is concentrated or the like before unintended rewrite of data due to a large number of readouts.

Therefore, it is an object of the present invention to provide means for avoiding or reducing the read disturb phenomenon even in various types of nonvolatile memories without any restriction depending on cell configurations of memories.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
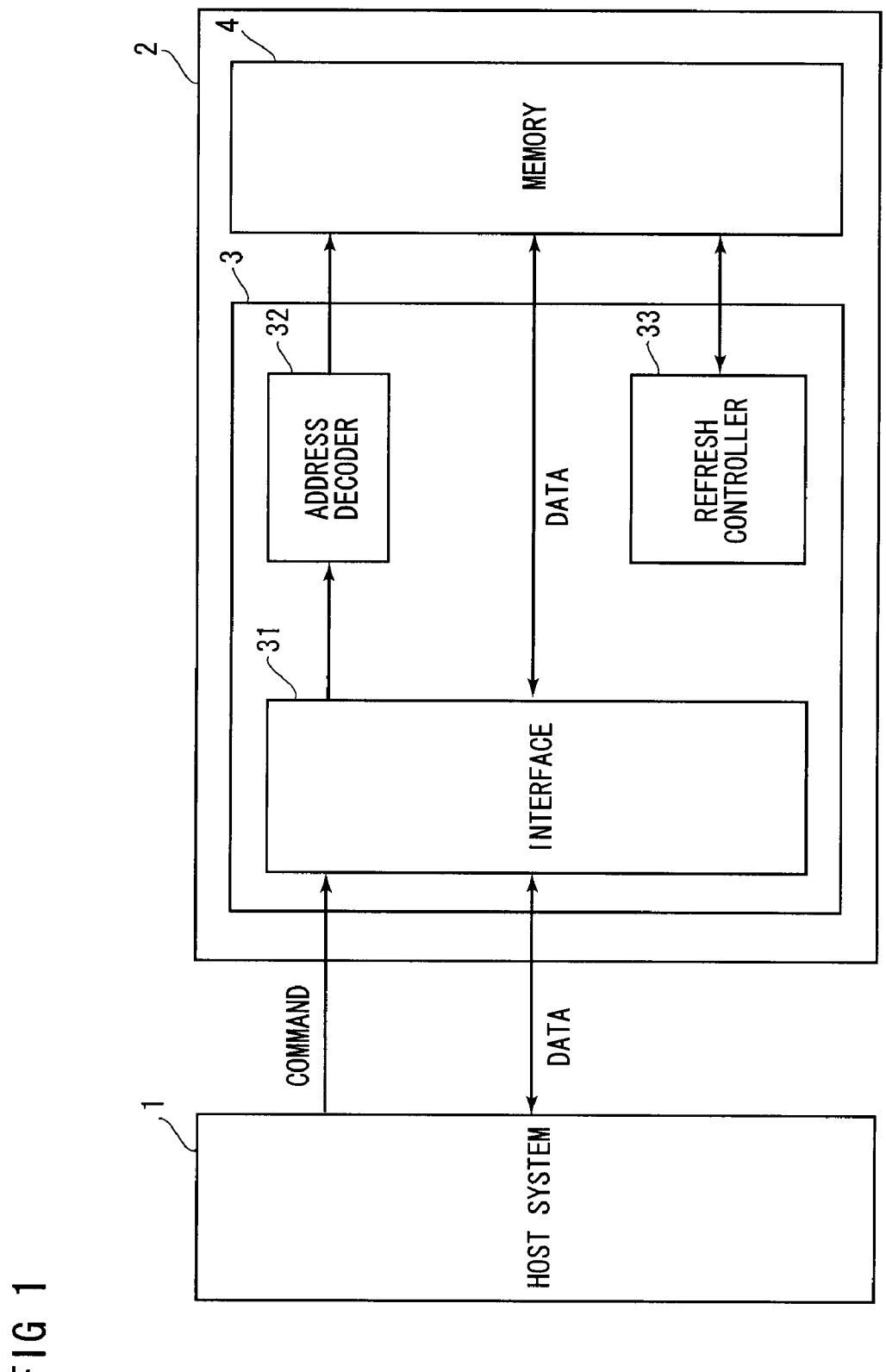
FIG. 1 is a block diagram showing an information processing system in accordance with preferred embodiments of the present invention.

Hereinafter, the preferred embodiments of the present invention will be discussed with reference to figures. FIG. 1 is a functional block diagram showing an information processing system in accordance with the preferred embodiments of the present invention. The information processing system comprises a host system 1 and a memory module 2. The memory module 2 comprises a memory controller 3 and a memory 4.

In the preferred embodiments of the present invention, as the memory 4 adopted is an NAND flash memory which is a rewritable nonvolatile semiconductor memory. The memory controller 3 controls reading and writing of data from/to the memory 4. The information processing system serves as, for example, a game device. In such a case, the host system 1 is a game device body and the memory module 2 is a game cartridge. The memory module 2 may be detachable from the host system 1 or may be integrated in a constituent device of the host system 1. In the preferred embodiments, the memory module 2 is equipped with the memory controller 3, but there may be a constitution where the host system 1 is equipped with the memory controller 3.

As shown in FIG. 1, the memory controller 3 comprises an interface 31, an address decoder 32 and a refresh controller 33. The interface 31 serves as an input interface for inputting a read command or a write command outputted from the host system 1, and serves as an output interface for outputting read data outputted from the memory 4 to the host system 1. Alternatively, the interface 31 serves as an input interface for inputting write data outputted from the host system 1.

The address decoder 32 acquires a read address or a write address from the read command or the write command inputted through the interface 31. When the read address is outputted to the memory 4, stored data corresponding to the read address is read out from the memory 4. Further, when the write address and data are given to the memory 4, data is written into the memory 4.

The memory module 2 of the preferred embodiments uses a writable NAND flash memory and as mentioned above, is used as a memory whose main use is reading, such as a game cartridge. In other words, in response to read commands consecutively outputted from the host system 1, reading of data at the specified read addresses is repeatedly performed. The host system 1 receives data read out from the memory 4 to perform various operations.

Thus, in the preferred embodiments, there is a possibility that reading of data stored in the memory 4 may be performed repeatedly so many times. In such a case, there is a possibility of phenomenon where stored data are unintendedly changed i.e., the read disturb phenomenon, as mentioned above. Then, the memory controller 3 of the preferred embodiments comprises the refresh controller 33 in order to prevent this read disturb phenomenon.

Figure 2:
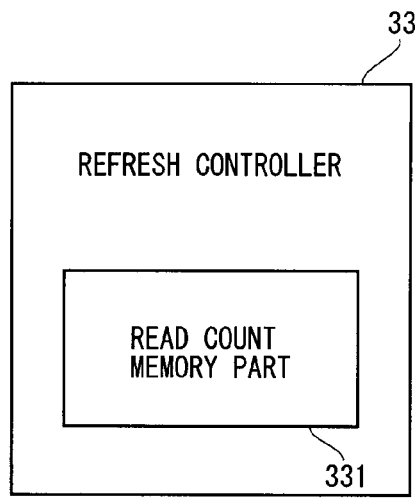
FIG. 2 is a block diagram showing a refresh controller in accordance with a first preferred embodiment.

As shown in FIG. 2, the refresh controller 33 comprises a read count memory part 331. The read count memory part 331 counts the number of readings for each page of the memory 4 and stores the read count. In other words, the read count memory part 331 stores the number of occurrences of read addresses included in the read command inputted from the host system 1. The read count memory part 331 may be provided in the host system 1. Alternatively, the read count memory part 331 may be provided in any element in the information processing system, such as one of other nonvolatile memories in the memory module 2 or a memory array storing game data.

As discussed above, in the preferred embodiments, an NAND flash memory is adopted as the memory 4. To the NAND flash memory, data can be read out on a page basis. Therefore, the read count memory part 331 stores the number of readings (read count) for each page of the memory 4.

Figure 3:
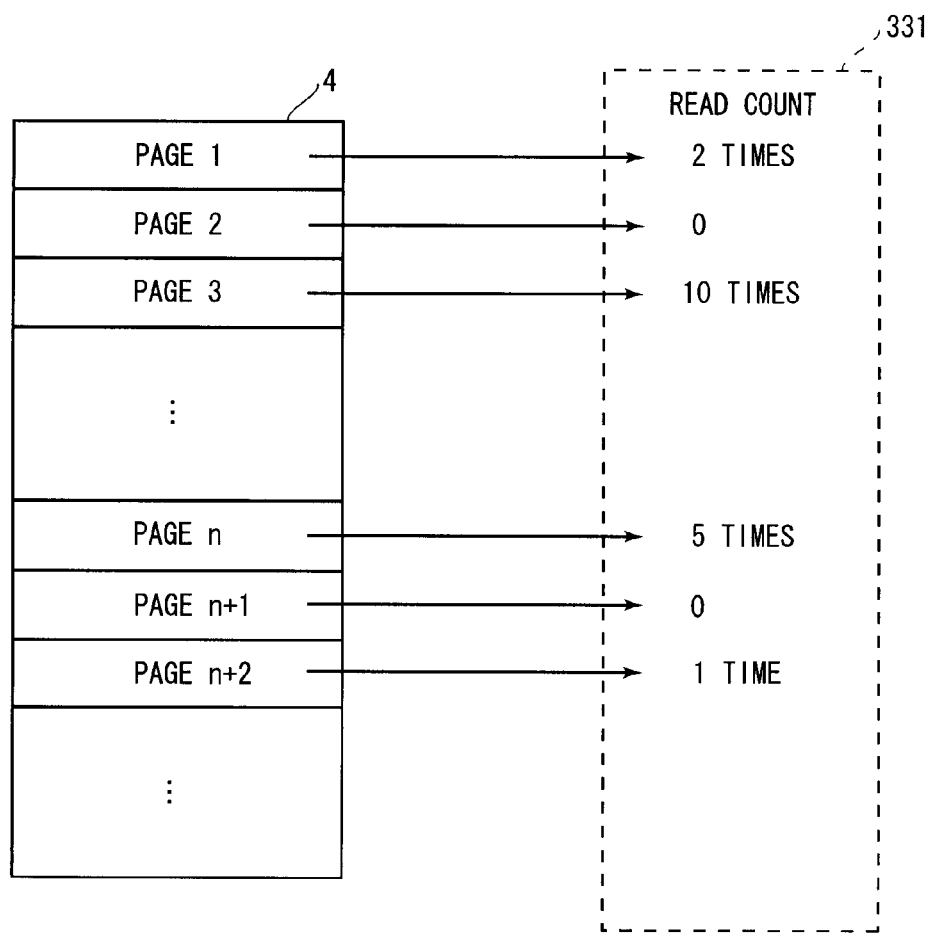
FIG. 3 is a view showing a method of selecting a refresh target page in accordance with the first preferred embodiment.

FIG. 3 is an image view showing the memory 4 which is divided by pages and information on read count stored in the read count memory part 331. In the exemplary case shown in FIG. 3, it is found that reading is performed on page 1 two times and reading is performed on page 3 ten times.

The refresh controller 33 controls the read count for each page by the read count memory part 331 and determines a page whose read count exceeds a predetermined number as a refresh target page. Then, the refresh controller 33 performs a rewrite operation of data stored in the refresh target page.

<Refresh Method>

As discussed above, the read count memory part 331 controls the read count for each page. Then, the page whose read count exceeds the predetermined number is determined as a refresh target area. When a page as refresh target area is thus determined, a rewrite operation is performed on the page by a method discussed below.

As the first method, data in a block including the page which is determined as the refresh target area is rewritten by using the block area. This block refers to a block which serves as a unit of erase in an NAND flash memory. The block consists of a plurality of page areas.

First, data in a block including the page which is determined as the refresh target area is once saved in a temporary memory (not shown). Specifically, data is read out for each page and stored in the temporary memory. The temporary memory may be provided in the memory controller 3. Next, the data in the block including the page which is determined as the refresh target area is erased. Then, finally, the data in the block, which is saved in the temporary memory, is written into the original block area again. Thus, the data in the block including the page as the refresh target area is rewritten.

Though there is a possibility that the read disturb phenomenon may be caused by repeat readouts of data as discussed in the background of the present invention, the data in the block whose read count becomes a large number is thus refreshed in the memory 4 and it is therefore possible to prevent unintended rewriting of data.

Since an NAND flash memory which is erasable on a block basis is used in this preferred embodiment, as discussed above, the data in the block including the refresh target area is stored in the temporary memory and the data in the block is erased. In a case where the unit of erase in the memory is small (e.g., byte or word), naturally, data in the small unit of erase may be saved in the temporary memory and rewritten. If only an area which corresponds to the refresh target area can be erased, for example, the data in the refresh target area is saved in the temporary memory and the refresh target area is erased. Then, the data in the refresh target area, which is saved in the temporary memory, is rewritten.

As the second method, the data stored in the page which is determined as the refresh target area is copied to another page area in the memory 4. Specifically, the data in the page whose read count exceeds the predetermined number is stored in another area in the memory 4.

Then, the refresh controller 33 updates reference information on the data so that the host system 1 can refer to the copied data in another area. As the reference information of data, FAT (File Allocation Table) is used in this preferred embodiment. The FAT is stored in the memory area of the memory 4. By updating the FAT, with respect to the page determined as the refresh target area, the area into which the copied data is stored is referred to. Through this operation, before the read count becomes a large number and unintended rewriting of data occurs, the data is rewritten into a new area and this allows the host system 1 to refer to highly reliable data which is rewritten.

The original data may be hold without change at this point of time. Then, when the data in all the pages of the block become unneeded (in other words, the data in all the pages of the block are copied to other pages), the data in the block may be erased. After the data are erased, the block can be used again as a writing area for other data.

As the third method, the data stored in the block including the page determined as the refresh target area is copied to another memory area in the memory 4. Specifically, the data in the block including the page whose read count exceeds the predetermined number is stored in another area in the memory 4. As discussed above, the block refers to a block serving as a unit of erase in the NAND flash memory.

Then, like in the second method, the refresh controller 33 updates the reference information on the data so that the host system 1 can refer to the copied data in another area. By updating the reference information (e.g., FAT), with respect to the block including the page determined as the refresh target area, the block to which the data is copied is referred to. Through this operation, before the read count becomes a large number and unintended rewriting of data occurs, the data is rewritten into a new area and this allows the host system 1 to refer to highly reliable data which is rewritten.

In the block in which the original data is stored, the data may be erased. The block can be used again as a writing area for other data.

As discussed above, in the case where the refresh target page is determined, there are three refresh methods. In the discussion below, "the rewrite operation on the refresh target page" uses any one of the above three methods. Though the read count memory part 331 counts the number of readings for each page in this preferred embodiment, however, the read count memory part 331 may count the number of readings, e.g., on a block basis.

<Refresh Timing>

Next, discussion will be made on the timing for "the rewrite operation on the refresh target page". As the timing for the rewrite operation, a plurality of exemplary cases will be discussed below.

As one of the examples, the rewrite operation is performed after the read operation on the memory 4 is performed. When the read operation on the memory 4 is performed by the memory controller 3, read count information for each page is updated by the read count memory part 331. Then, after the read count information is updated, the refresh controller 33 subsequently judges whether or not there is a page whose read count exceeds the predetermined number. If there is a page whose read count exceeds the predetermined number, the rewrite operation on the refresh target page is performed.

Alternatively, the rewrite operation may be performed at the timing where a power supply of the memory module 2 is turned ON or OFF. In a condition where the memory module 2 serving as a game cartridge is attached to the host system 1 serving as a game device body and the power supply of the game device body is turned ON, for example, the rewrite operation is performed. More specifically, there may be a case where the rewrite operation is performed at the timing before an application program (e.g., a game program) is executed after the power supply is turned ON and a boot program of the host system 1 is executed. Alternatively, when the power supply of the game device body is turned OFF, the rewrite operation is performed at the timing before stopping power supply to the memory module 2.

When the power supply is turned ON or OFF, the refresh controller 33 refers to the read count information on each page, which is stored in the read count memory part 331. Then, the page whose read count exceeds the predetermined number of readings is determined as a refresh target page and the rewrite operation on the refresh target page is performed.

Alternatively, the rewrite operation may be performed in response to a rewrite instruction signal which is inputted from out of the refresh controller 33. At the timing where the rewrite instruction signal is inputted from the host system 1, for example, the refresh controller 33 refers to the read count information on each page, which is stored in the read count memory part 331. Then, the refresh controller 33 determines a page whose read count exceeds the predetermined number of readings as the refresh target page and performs the rewrite operation on the refresh target page.

The host system 1 can send the rewrite instruction signal to the memory module 2 with any algorithm. The host system 1 may send a timing signal periodically, for example.

As another method, the refresh controller 33 holds a timing schedule table and can perform the rewrite operation in accordance with this schedule. The memory controller 3 may be provided with a timer therein. The refresh controller 33 controls the rewrite timing on the basis of the timing schedule table and refers to the read count memory part 331 at the point of time when the rewrite timing comes. Then, like in the above methods, the refresh controller 33 determines a page whose read count exceeds the predetermined number of readings as the refresh target page and performs the rewrite operation on the refresh target page.

As still another method, the rewrite operation may be performed at the timing where no access is made to the memory 4. The refresh controller 33 monitors whether or not access is made to the memory 4 by the memory controller 3. At the timing where no access is made to the memory 4, the refresh controller 33 refers to the read count memory part 331 and determines a page whose read count exceeds the predetermined number of readings as the refresh target page. Then, the refresh controller 33 performs the rewrite operation on the refresh target page. At the timing where the game device is being charged with electricity, for example, the rewrite operation is performed.

As yet another method, if the information processing system is a game device, the rewrite operation may be performed at the timing of data backup. Specifically, while a game program is in process, a backup of user data into a predetermined memory part is sometimes needed, and at this timing, the refresh controller 33 refers to the read count memory part 331 and determines a page whose read count exceeds the predetermined number of readings as the refresh target page. Then, the refresh controller 33 performs the rewrite operation on the refresh target page. Alternatively, even if the information processing system executes various application programs other than the game program, the rewrite operation may be performed at the timing of data backup by the application.

The Second Preferred Embodiment

Next, the second preferred embodiment of the present invention will be discussed. The constitution of the information processing system in the second preferred embodiment is the same as that of the first preferred embodiment discussed above with reference to FIG. 1. In the first preferred embodiment, the read count for each page is recorded and the rewrite operation is performed in accordance with the read count. In contrast to this, in the second preferred embodiment, the rewrite operation of data is sequentially performed on all the pages regardless of the read count.

Figure 4:
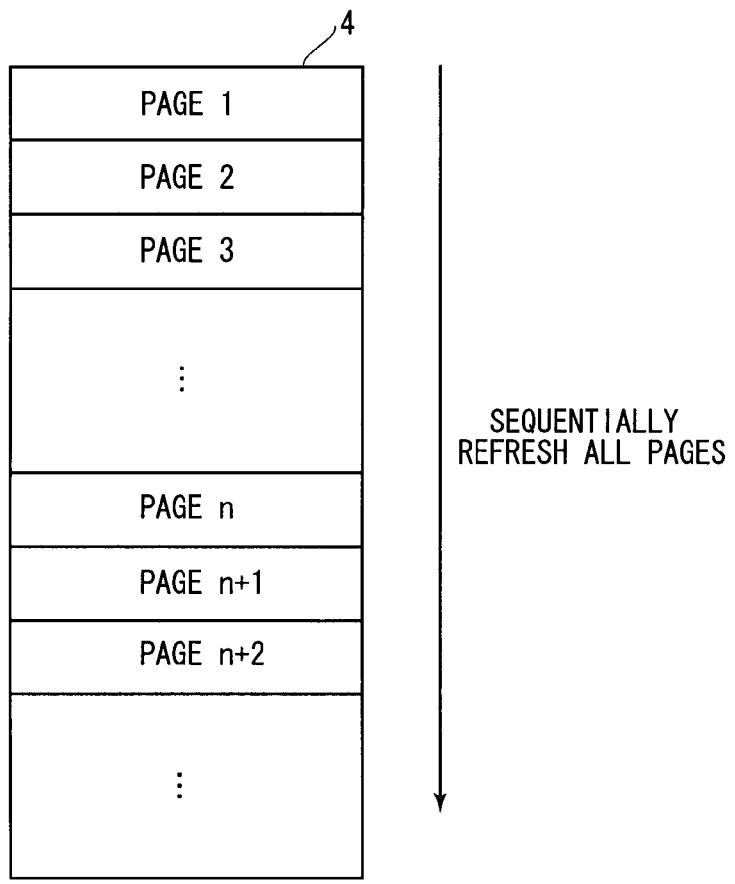
FIG. 4 is a view showing a method of selecting a refresh target page in accordance with a second preferred embodiment.

FIG. 4 is an image view showing a method of determining a refresh target area. In this exemplary case, the refresh controller 33 determines all the pages as the refresh target area sequentially from page 1.

At a timing, for example, the rewrite operation is performed on page 1, and at the next timing, the rewrite operation is performed on page 2. Thus, by sequentially incrementing the pages, the rewrite operation is performed on the pages. The order of selection for the pages and the algorithm used therefor is freely determined. For example, the pages may be sequentially determined as the refresh target page from the largest page address, or may be selected at predetermined intervals.

In <Refresh Methods> of the first preferred embodiment, three methods have been discussed. These three methods can be also applied to the second preferred embodiment.

The first method, for example, where the block including the refresh target page is once saved in the temporary memory, can be applied to the second preferred embodiment. In this case, the refresh target page may be incremented by one page, but in such a method, the rewrite operation is consecutively performed on the same block. Then, the first page of each block may be sequentially selected as the refresh target page. The method where the first page of each block is sequentially selected is equivalent to a method where block areas are sequentially selected as the refresh target area.

Further, application of the third method where the data in the block including the refresh target page is copied to another area in the memory 4 to the second preferred embodiment works in like manner. All the pages may be sequentially selected as the refresh target page or the first page of each block may be sequentially selected. Then, the data may be written into another area on a block basis and the reference information may be rewritten.

In a case of selecting the second method, the data in the sequentially-selected pages may be copied to another page area and the reference information may be rewritten.

As to the refresh timing, the timings discussed in the first preferred embodiment can be applied to the second preferred embodiment. The refresh target page is determined and the rewrite operation is performed on the refresh target page every time when the power supply of the memory module 2 is turned ON or OFF. Every time when the power supply is turned ON, for example, refresh of a different block is performed.

Alternatively, the refresh controller 33 receives the refresh timing signal from the host system 1 and every time when the signal is given, the refresh controller 33 changes the refresh target page and performs the rewrite operation on the refresh target page. Similarly, there may be a case where the refresh controller 33 controls the refresh schedule and sequentially performs the rewrite operation on the different refresh target pages in accordance with the schedule, and there may be another case where the refresh controller 33 performs the rewrite operation on the refresh target page at the timing where no access is made to the memory 4. Alternatively, the rewrite operation may be performed during backup of game data.

The Third Preferred Embodiment

Next, the third preferred embodiment of the present invention will be discussed. The constitution of the information processing system in the third preferred embodiment is the same as that of the first preferred embodiment discussed above with reference to FIG. 1. In the third preferred embodiment, a data rewrite operation is performed on a page which is specified in advance.

Figure 5:
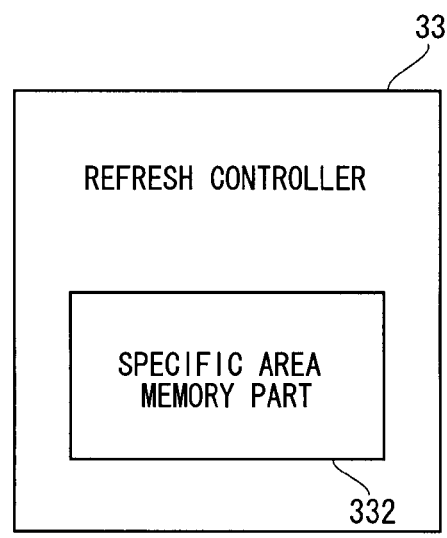
FIG. 5 is a block diagram showing a refresh controller in accordance with a third preferred embodiment.
Figure 6:
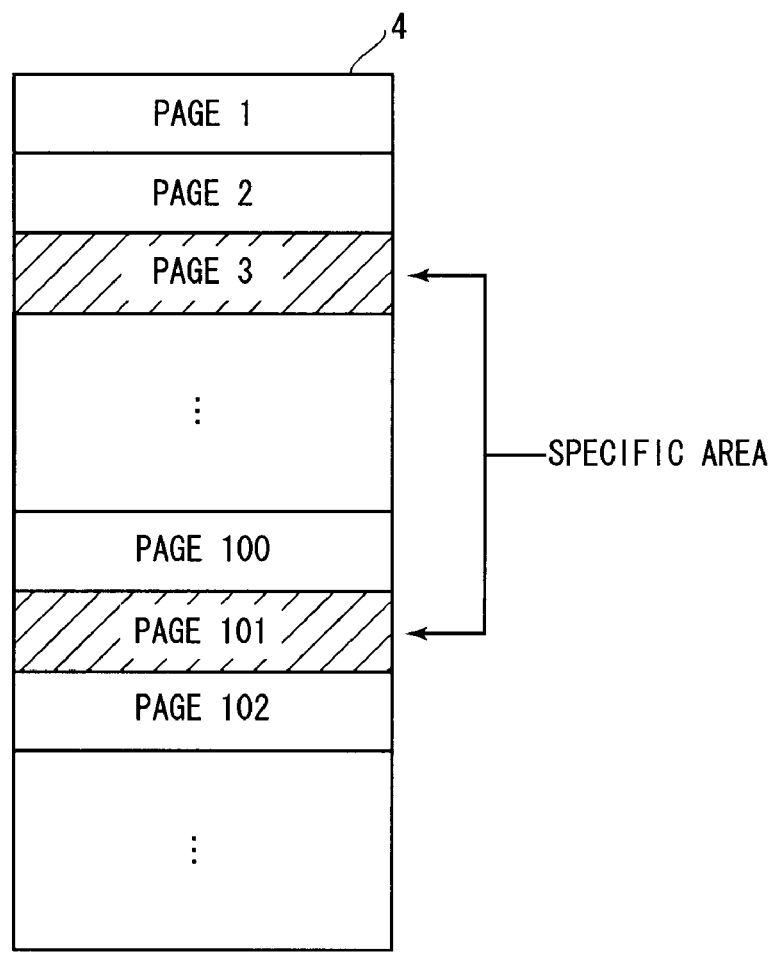
FIG. 6 is a view showing a refresh target page in accordance with the third preferred embodiment.
Figure 7:
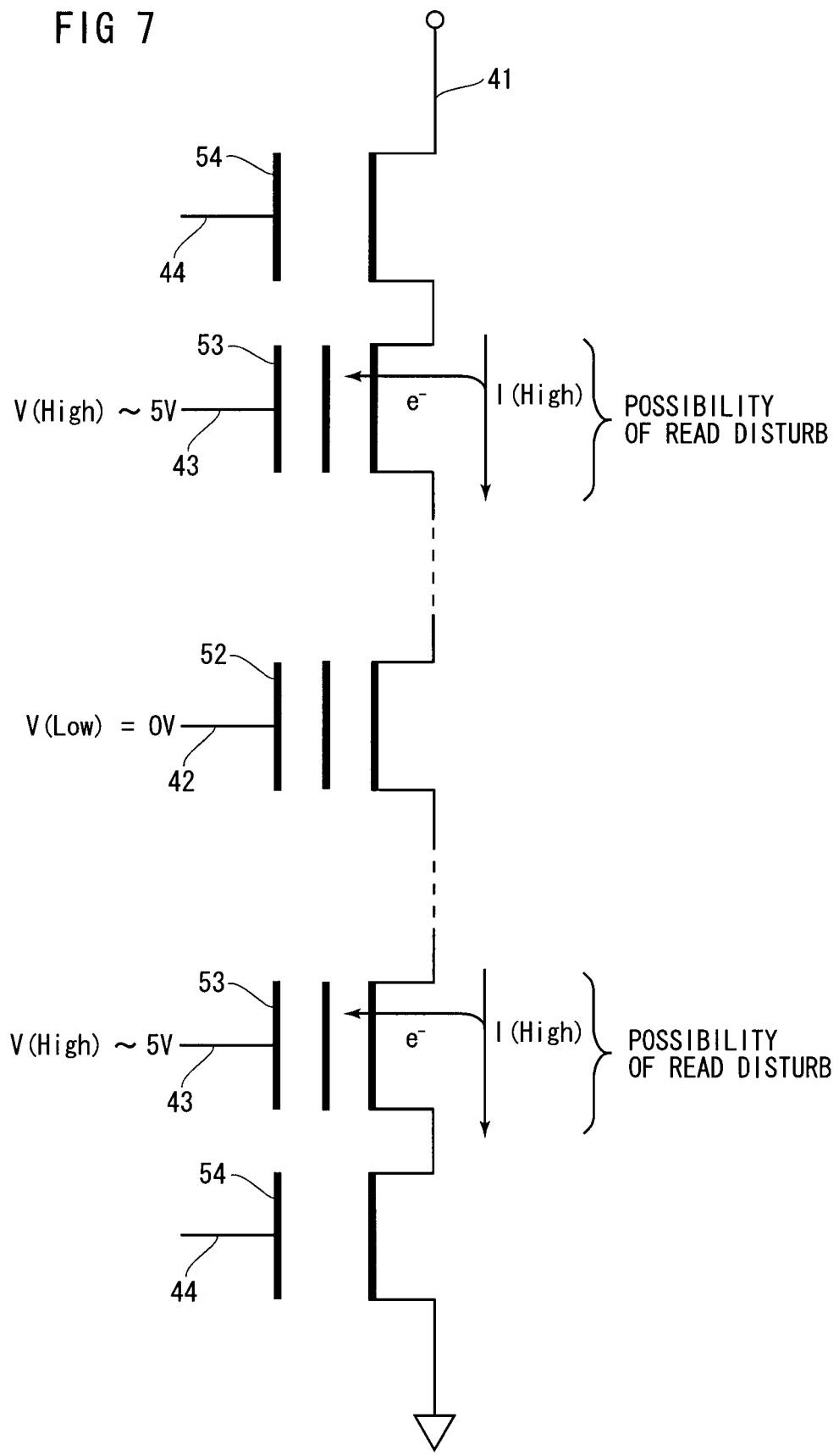
FIG. 7 is a view showing an operation of occurrence of read disturb phenomenon.

As shown in FIG. 5, the refresh controller 33 of the third preferred embodiment comprises a specific area memory part 332. The specific area memory part 332 stores an address of an area which is specified in advance as an area on which the rewrite operation is to be performed. For example, an address which is assumed to be repeatedly accessed for reading, judged from the characteristics of data stored in the memory 4, is specified. Alternatively, an address of an area which is assumed to cause unintended rewrite of data (read disturb), judged from physical properties of the memory 4, is specified. As shown in FIG. 6, for example, specific addresses, such as pages 3 and 101, are specified in advance and stored in the specific area memory part 332. The specific area memory part 332 may be provided in the host system 1. Alternatively, the specific area memory part 332 may be provided in any element in the information processing system, such as another nonvolatile memory in the memory module 2 or the memory array which stores the game data.

The third preferred embodiment also uses any one of the three refresh methods discussed in the first preferred embodiment, The first method, for example, where the block including the refresh target page is once saved in the temporary memory, can be applied to the third preferred embodiment.

Further, like in the second method, only the refresh target page may be copied to another area in the memory 4 and the reference information may be changed. In the case where the address to be stored in the specific area memory part 332 is determined in accordance with the characteristics of data, information on the address stored in the specific area memory part 332 has to be updated as well as the reference information since it is necessary to avoid the read disturb phenomenon on the copied data again.

Further, the third method where the data in the block including the refresh target page is copied to another area in the memory 4 may be applied to the third preferred embodiment. In the case where the address to be stored in the specific area memory part 332 is determined in accordance with the characteristics of data, the information on the address stored in the specific area memory part 332 has to be updated as well as the reference information.

As to the refresh timing, the timings discussed in the first preferred embodiment can be applied to the third preferred embodiment. The rewrite operation may be performed on the specific area every time when the power supply of the memory module 2 is turned ON or OFF. Alternatively, the refresh controller 33 receives the refresh timing signal from the host system 1 and every time when the signal is given, the refresh controller 33 performs the rewrite operation on the specific area. Similarly, there may be a case where the refresh controller 33 controls the refresh schedule and performs the rewrite operation in accordance with the schedule, and there may be another case where the refresh controller 33 performs the rewrite operation at the timing where no access is made to the memory 4. Alternatively, the rewrite operation may be performed during backup of game data.

All the preferred embodiments have been discussed as methods for avoiding occurrence of the read disturb phenomenon, and any combination of these methods may be applied. The combination of the first and third preferred embodiments, for example, may be used. By using this combination, it becomes possible to perform a rewrite operation on areas on which read operations are actually concentrated and areas on which concentration of read operations is anticipated.

While the invention has been shown and described in detail, the foregoing description is in all aspects illustrative and not restrictive. It is therefore understood that numerous modifications and variations can be devised without departing from the scope of the invention.

What is claimed is:

1. A memory controller for controlling access to a rewritable nonvolatile semiconductor memory, comprising:
   area determination means for determining a refresh target area in a memory area of said nonvolatile semiconductor memory based on a number of read operations performed on the memory area; and
   rewriting means for rewriting stored data which is stored in said refresh target area into the memory area in said nonvolatile semiconductor memory.

2. The memory controller according to claim 1, wherein said area determination means includes
   means for determining an area whose read count exceeds a predetermined number among the memory areas in said nonvolatile semiconductor memory as said refresh target area.

3. The memory controller according to claim 1, wherein said area determination means includes
   means for determining all the memory areas in said nonvolatile semiconductor memory sequentially as said refresh target area in accordance with a predetermined rule.

4. The memory controller according to claim 1, wherein said area determination means includes
   means for determining a predetermined area among the memory areas in said nonvolatile semiconductor memory as said refresh target area.

5. The memory controller according to claim 2, wherein said rewriting means performs a rewrite operation on said refresh target area after reading data from said nonvolatile semiconductor memory.

6. The memory controller according to claim 1, wherein said rewriting means includes
   means for performing a rewrite operation of the stored data to said refresh target area when a power supply of said nonvolatile semiconductor memory is turned ON or OFF.

7. The memory controller according to claim 1, wherein said rewriting means includes
   means for performing a rewrite operation of the stored data to said refresh target area in response to a rewrite timing instruction which is externally inputted.

8. The memory controller according to claim 1, wherein said rewriting means includes
   means for performing a rewrite operation of the stored data to said refresh target area in accordance with a predetermined timing schedule.

9. The memory controller according to claim 1, wherein said rewriting means includes
   means for performing a rewrite operation of the stored data to said refresh target area at the timing where no access is made to said nonvolatile semiconductor memory from a host system.

10. The memory controller according to claim 1, wherein said rewriting means includes
    means for performing a rewrite operation of the stored data to said refresh target area at the timing of data backup.

11. A memory controller for controlling access to a rewritable nonvolatile semiconductor memory, comprising:
    area determination means for determining a refresh target area in a memory area of said nonvolatile semiconductor memory; and
    rewriting means for rewriting stored data which is stored in said refresh target area into the memory area in said nonvolatile semiconductor memory, said rewriting means including means for storing data of said refresh target area into a temporary memory, erasing the data of said refresh target area and storing data which is saved in said temporary memory into said refresh target area again.

12. A memory controller for controlling access to a rewritable nonvolatile semiconductor memory, comprising:
    area determination means for determining a refresh target area in a memory area of said nonvolatile semiconductor memory; and
    rewriting means for rewriting stored data which is stored in said refresh target area into the memory area in said nonvolatile semiconductor memory, said rewriting means including means for storing data of a block area including said refresh target area into a temporary memory, erasing the data of said block area and storing data which is saved in said temporary memory into said block again.

13. A memory controller for controlling access to a rewritable nonvolatile semiconductor memory, comprising:
    area determination means for determining a refresh target area in a memory area of said nonvolatile semiconductor memory; and
    rewriting means for rewriting stored data which is stored in said refresh target area into the memory area in said nonvolatile semiconductor memory, said rewriting means including means for storing data of said refresh target area into another area in the memory area of said nonvolatile semiconductor memory and changing reference information on the data to a new storage area.

14. A memory controller for controlling access to a rewritable nonvolatile semiconductor memory, comprising:
    area determination means for determining a refresh target area in a memory area of said nonvolatile semiconductor memory; and
    rewriting means for rewriting stored data which is stored in said refresh target area into the memory area in said nonvolatile semiconductor memory, said rewriting means including means for storing data of a block area including said refresh target area into another area in the memory area of said nonvolatile semiconductor memory and changing reference information on the data to a new storage area.

15. The memory controller according to claim 12, wherein said block area is a unit of erase in said nonvolatile semiconductor memory.

16. The memory controller according to claim 14, wherein said block area is a unit of erase in said nonvolatile semiconductor memory.

* * * * *